US009251298B2

United States Patent
Huang et al.

(10) Patent No.: US 9,251,298 B2
(45) Date of Patent: Feb. 2, 2016

(54) ELECTRICAL NETWORK MODEL SYNCHRONIZATION

(71) Applicant: ABB Technology AG, Zurich (CH)

(72) Inventors: Wei Huang, Oviedo, FL (US); Douglas A. Voda, Sanford, FL (US); David C. Lawrence, Raleigh, NC (US)

(73) Assignee: ABB TECHNOLOGY AG, Zurich (CH)

( * ) Notice: Subject to any disclaimer, the term of this patent is extended or adjusted under 35 U.S.C. 154(b) by 524 days.

(21) Appl. No.: 13/687,901

(22) Filed: Nov. 28, 2012

(65) Prior Publication Data

US 2014/0149101 A1 May 29, 2014

(51) Int. Cl.
G06F 17/50 (2006.01)
H02J 3/12 (2006.01)
H02J 3/00 (2006.01)
H02J 3/16 (2006.01)
H02J 3/18 (2006.01)

(52) U.S. Cl.
CPC . *G06F 17/50* (2013.01); *H02J 3/12* (2013.01); *H02J 3/006* (2013.01); *H02J 3/16* (2013.01); *H02J 3/1821* (2013.01); *H02J 2003/001* (2013.01); *H02J 2003/007* (2013.01); *Y02E 40/30* (2013.01); *Y02E 60/76* (2013.01); *Y04S 10/525* (2013.01); *Y04S 40/22* (2013.01)

(58) Field of Classification Search
CPC ........... G06F 17/50; H02J 3/12; H02J 3/1821; H02J 3/16; H02J 3/006; H02J 2003/007; H02J 2003/001; Y02E 40/30; Y02E 60/76; Y04S 40/22; Y04S 10/525
See application file for complete search history.

(56) References Cited

U.S. PATENT DOCUMENTS

| 7,454,255 | B1* | 11/2008 | Boskovic et al. | 700/79 |
| 2010/0114398 | A1 | 5/2010 | Feng et al. | |
| 2010/0114400 | A1 | 5/2010 | Feng et al. | |
| 2011/0115308 | A1* | 5/2011 | Wang et al. | 307/125 |
| 2012/0310558 | A1* | 12/2012 | Taft | 702/61 |
| 2012/0310559 | A1* | 12/2012 | Taft | 702/62 |

(Continued)

FOREIGN PATENT DOCUMENTS

| EP | 2081273 A2 | 7/2009 |
| WO | 2008054664 A1 | 5/2008 |

(Continued)

OTHER PUBLICATIONS

Int. Search Report cited in PCT Application No. PCT/US2013/071820 dated Jun. 11, 2014, 3 pgs.

*Primary Examiner* — Ramesh Patel
(74) *Attorney, Agent, or Firm* — Cooper Legal Group, LLC (57) ABSTRACT

Among other things, one or more techniques and/or systems are provided for maintaining an electrical network model describing an electrical network. A fault detection, fault isolation, and load restoration (FDIR) component, a voltage/var control (VVC) component, and/or other components may be provided with access to the electrical network model so that the components may have access to relatively up-to-date and/or accurate information describing the electrical network when executing functionality for the electrical network. For example, the FDIR component and the VVC component may be synchronized based upon the electrical network model so that the FDIR component may have notice of network changes by the VCC component, and/or the VCC component have may have notice of network changes by the FDIR component.

20 Claims, 7 Drawing Sheets

(56) References Cited

U.S. PATENT DOCUMENTS

| | | | |
|---|---|---|---|
| 2012/0324271 A1* | 12/2012 | Nigam et al. | 714/2 |
| 2013/0054216 A1* | 2/2013 | San Andres | 703/13 |
| 2013/0138260 A1* | 5/2013 | Divan et al. | 700/298 |
| 2013/0173078 A1* | 7/2013 | Divan et al. | 700/295 |
| 2013/0197706 A1* | 8/2013 | Losee et al. | 700/295 |
| 2013/0218357 A1* | 8/2013 | San Andres et al. | 700/292 |
| 2013/0282189 A1* | 10/2013 | Stoupis et al. | 700/286 |
| 2014/0049990 A1* | 2/2014 | Limpaecher | 363/15 |
| 2014/0354234 A1* | 12/2014 | Sudan et al. | 320/127 |

FOREIGN PATENT DOCUMENTS

| | | |
|---|---|---|
| WO | 2009076410 A1 | 6/2009 |
| WO | 2010045092 A2 | 4/2010 |
| WO | 2010080490 A1 | 7/2010 |
| WO | 2013158813 A1 | 10/2013 |

* cited by examiner

ELECTRICAL NETWORK MODEL SYNCHRONIZATION

BACKGROUND

An electrical network, such as a power grid, may provide electrical power for numerous users. The electrical network may comprise one or more feeder lines. For example, a first feeder line may supply electrical power to a first set of users, while a second feeder line may supply electrical power to a second set of users. The first feeder line and the second feeder line may be interconnected by a breaker switch that may be opened to isolate the two feeder lines or may be closed to connect the two feeder lines. Fault detection, fault isolation, and load restoration (FDIR) functionally may be used to automate switching and/or routing within the electrical network, such as between the first feeder line and the second feeder line. For example, upon detecting a fault along the first feeder line, the FDIR may isolate the fault by opening local breaker switches around the fault, and may close the breaker switch between the feeder lines so that the second feeder may provide electrical power to the non-isolated portion of the first feeder line. Voltage/var control (VVC) functionality may be used to improve quality of a feeder line. For example, the VVC may mitigate phase shifts associated with voltage and/or current (e.g., phase shifts introduced by loads, such as motors) by utilizing capacitor banks to control voltage along the feeder line. Because changes made to the electrical network by the FDIR may be unknown to the VVC, and changes along a feeder line by the VVC may be unknown to the FDIR, the VCC and/or the FDIR may make suboptimal decisions by using stale information regarding the electrical network.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

Among other things, one or more systems and/or techniques for synchronizing a fault detection, fault isolation, and load restoration (FDIR) component and a voltage/var control (VVC) component are provided herein. That is, an electrical network may comprise various devices, such as capacitor banks, measurement devices, load tap changers, breaker switches, substations, transformers, and/or other devices. The FDIR component and/or the VVC component may provide functionality for the electrical network, such as for a feeder line, based upon a state of the electrical network (e.g., load information, voltage information, current information, breaker switch statuses, electrical network faults, available capacitor banks, etc.). Because the FDIR component may be unaware of changes made to the state of the electrical network by the VVC component (e.g., a change in voltage) and/or the VVC component may be unaware of changes made to the state of the electrical network by the FDIR component (e.g., isolation of a fault and/or connection of two feeder lines by closing a breaker switch), the FDIR component and/or the VVC component may make suboptimal decisions due to a lack of current information about the electrical network. Accordingly, as provided herein, an electrical network model describing device connections within the electrical network may be maintained (e.g., stored within a database of a substation control center) and/or synchronized between the FDIR component and the VVC component. In this way, the FDIR component and/or the VVC component may execute functionality utilizing relatively up-to-date information about the electrical network within the electrical network model.

The electrical network model may comprise a variety of information about the electrical network, such as status of capacitor banks, current flow measurements, load tap changer information, status of breaker switches, a circuit topology of the electrical network, and/or other information (e.g., information that may be used by functionality of the FDIR component, the VVC component, and/or other components). In one example of maintaining the electrical network model, one of more field devices within the electrical network may be queried for network information (e.g., a field device may report a list of devices with which the field device is connected and/or measurement data known to the field device).

In another example of maintaining the electrical network model, a network change to the electrical network by the FDIR component may be identified (e.g., the FDIR component may open or close a breaker switch based upon a fault isolation operation and/or a fault restoration operation). Accordingly, the electrical network model may be updated based upon the network change to create an updated electrical network model. The VVC component and/or other components may be notified of the updated electrical network model (e.g., the updated electrical network model may comprise an indication that a new capacitor bank is available to a feeder line or that a capacitor bank is no longer available to a feeder line). For example, the VVC component may be invoked to perform a power factor correction operation, a voltage correction operation, and/or a phase correction operation based upon the updated electrical network model.

In another example of maintaining the electrical network model, a network change to the electrical network by the VVC component may be identified (e.g., the VVC component may change a status of a capacitor bank, which may change a capacitance within the electrical network). Accordingly, the electrical network model may be updated based upon the network change to create an updated electrical network model. The FDIR component and/or other components may be notified of the updated electrical network model (e.g., the updated electrical network model may comprise an indication of a change in status of a capacitor bank associated with a feeder line). For example, the FDIR component may be invoked to perform a load evaluation operation based upon the updated electrical network model.

In this way, the FDIR component may be synchronized with the electrical network model so that FDIR functionality may take into consideration relatively up-to-date information associated with the electrical network model (e.g., changes made by the VVC component). Similarly, the VVC component may be synchronized with the electrical network model so that VVC functionality may take into consideration relatively up-to-date information associated with the electrical network model (e.g., changes made by the FDIR component).

The following description and annexed drawings set forth certain illustrative aspects and implementations. These are indicative of but a few of the various ways in which one or more aspects may be employed. Other aspects, advantages, and/or novel features of the disclosure will become apparent from the following detailed description when considered in conjunction with the annexed drawings.

DETAILED DESCRIPTION

The claimed subject matter is now described with reference to the drawings, wherein like reference numerals are generally used to refer to like elements throughout. In the following description, for purposes of explanation, numerous specific details are set forth in order to provide an understanding of the claimed subject matter. It may be evident, however, that the claimed subject matter may be practiced without these specific details. In other instances, structures and devices are illustrated in block diagram form in order to facilitate describing the claimed subject matter.

Many electrical networks, such as power grids, may utilize a fault detection, fault isolation, and load restoration (FDIR) component and/or a voltage/var control (VVC) component. The FDIR component may be configured to automate switching and routing within the electrical network. For example, the FDIR component may detect a fault, isolate the fault (e.g., open one or more breaker switches around a faulty area to isolate a healthy portion of the electrical network from the faulty area), and may restore electrical power to the healthy portion (e.g., a breaker switch connecting a different feeder line to the healthy portion may be closed so that the feeder line may supply electrical power to the healthy portion). In this way, reliability and power outage response may be improved for the electrical network by the FDIR component. The VVC component may be configured to maintain desired voltage along a feeder line (e.g., a voltage of 110V with a 5-10% deviation allowance) and/or mitigate voltage or current phase shifts introduced by loads, such as motors. Currently, an FDIR component and VVC component may have relatively low awareness of one another, such that a change made to the electrical network by one component may not be known to the other component, which may result in suboptimal decision making by the components.

Accordingly, as provided herein, the FDIR component, the VVC component, and/or other components of the electrical network may be synchronized through an electrical network model that describes the electrical network (e.g., device connections, electrical measurements, switch statuses, capacitor bank statuses, a circuit topology, etc.). In this way, the FDIR component and the VVC component may be aware of changes made to the electrical network by one another so that FDIR functionality and/or VVC functionality may take into account relatively up-to-date and accurate electrical network information during decision making processing.

Figure 1:
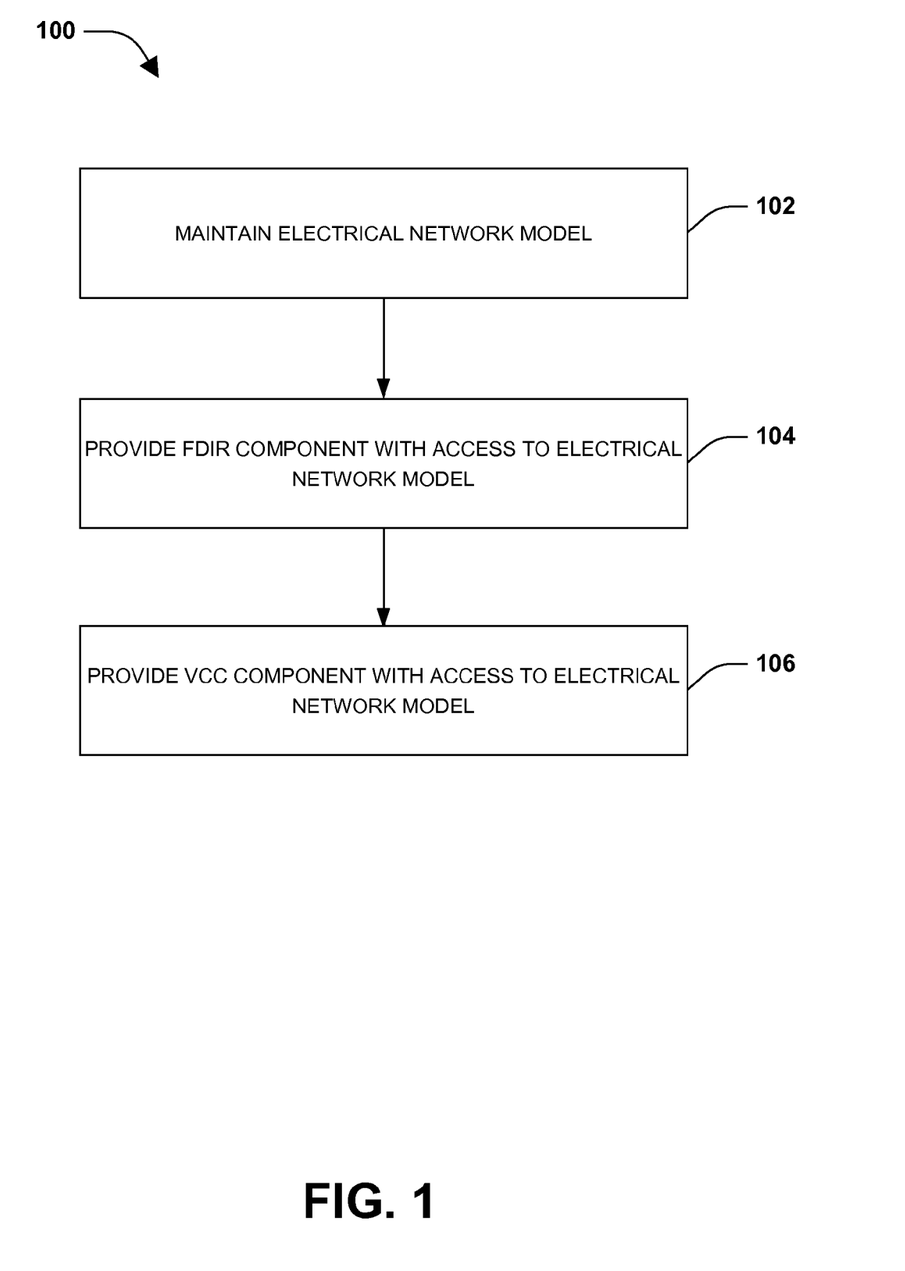
FIG. 1 is a flow diagram illustrating an exemplary method of synchronizing an FDIR component and a VVC component.

One embodiment of synchronizing an FDIR component and a VVC component is illustrated by an exemplary method 100 in FIG. 1. At 102, an electrical network model associated with an electrical network may be maintained. For example, the electrical network model may be maintained within a repository, such as a database (e.g., a database of a substation control center). The electrical network model may comprise a variety of information associated with the electrical network, such as information describing device connections within the electrical network, capacitor bank information, electrical measurement information, load tap changer information, breaker switch information, a circuit topology of the electrical network, and/or other information. The electrical network model may be maintained relatively up-to-date (e.g., updated) based upon information obtained from the electrical network. In one example, one or more field devices (e.g., electrical components within a power grid) may be queried for electrical network information that may be used to update the electrical network model. In another example, changes to the electrical network (e.g., a closing or opening of a breaker switch, utilization of a capacitor bank, etc.) by an FDIR component, a VVC component, and/or other components may be used to update the electrical network model. It may be appreciated that an example of an electrical network model 502 is illustrated in example 500 of FIG. 5.

At 104, the FDIR component may be provided with access to the electrical network model. At 106, the VVC component may be provided with access to the electrical network model. In one example of providing access, the electrical network model may be made available for polling by the FDIR component and/or the VVC component (e.g., a component may query a database comprising the electrical network model to obtain electrical network information). In another example of providing access, a new network status (e.g., information associated with a relatively recent change to the electrical network) may be pushed to the FDIR component and/or the VVC component.

The electrical network model may be updated based upon changes to a status of the electrical network. In one example, the electrical network model may be updated with new measurement data from a field device (e.g., voltage information, timing/delay information, current information, load information, etc.). In another example, the electrical network model may be updated based upon equipment changes (e.g., an addition of a new device within the electrical network, a malfunction of a device, a change in status of a device, etc.). In another example, the electrical network model may be updated based upon a change to the electrical network by a device (e.g., a capacitor bank, a breaker switch, a transformer, etc.) or component (e.g., the VVC component and/or the FDIR component).

In one example of updating the electrical network model based upon a network change by the FDIR component, a network change to the electrical network by the FDIR component may be identified (e.g., the FDIR component or a field device may report the network change or the network change may be discovered by polling the FDIR component or the field device). The network change, for example, may correspond to a change in status of a breaker switch associated with a fault isolation operation and/or a fault restoration operation by the FDIR component. It may be appreciated that an example of a network change by an FDIR component is illustrated in example 300 of FIG. 3. The electrical network model maybe updated based upon the network change to create an updated electrical network model. For example, the updated electrical network model may comprise an indication that a new capacitor bank is available to a feeder line (e.g., a breaker switch between the feeder line and a second feeder line comprising the new capacitor bank may be closed by the FDIR component so that the new capacitor bank is available to the feeder line) and/or an indication that a capacitor bank is no longer available to a feeder line (e.g., a faulty area along the feeder line may be isolated by the FDIR component so that a healthy portion of the feeder line isolated from the fault area).

The updated electrical network model may be made available to various components, such as the VVC component. For example, the VVC component may be notified of the updated electrical network model (e.g., a notification may be provided to the VVC component, the VVC component may discover the update based upon polling the updated electrical network model, new network status data may be provided to the VVC component, etc.). The VVC component may be invoked to perform VVC functionality, such as power factor correction, voltage correction, and/or phase correction, based upon the updated electrical network model (e.g., because the network change may have rendered prior adjustments by the VVC component suboptimal/ineffective for a new state of the electrical network).

In one example of updating the electrical network model based upon a network change by the VVC component, a network change to the electrical network by the VVC component may be identified (e.g., the VVC component or a field device may report the network change or the network change may be discovered by polling the VVC component or the field device). The network change, for example, may correspond to a capacitance change within the electrical network by the VVC component (e.g., the VVC component may utilize a capacitor bank to provide additional capacitance to a feeder line in order to adjust a voltage, a power factor, and/or a phase associated with the feeder line). It may be appreciated that an example of a network change by a VVC component is illustrated in example 400 of FIG. 4. The electrical network model may be updated based upon the network change to create an updated electrical network model. For example, the updated electrical network model may comprise an indication of the change in capacitance and/or a status of the capacitor bank.

The updated electrical network model may be made available to various components, such as the FDIR component. For example, the FDIR component may be notified of the updated electrical network model (e.g., a notification may be provided to the FDIR component, the FDIR component may discover the update based upon polling the updated electrical network model, new network status data may be provided to the FDIR component, etc.). The FDIR component may be invoked to perform FDIR functionality, such as load evaluation functionality, based upon the updated electrical network model (e.g., because the network change may have rendered prior adjustments by the FDIR component suboptimal/ineffective for a new state of the electrical network). In this way, the FDIR component and the VVC component may be synchronized (e.g., provided with relatively up-to-date information associated with the electrical network) based upon the electrical network model.

Figure 2:
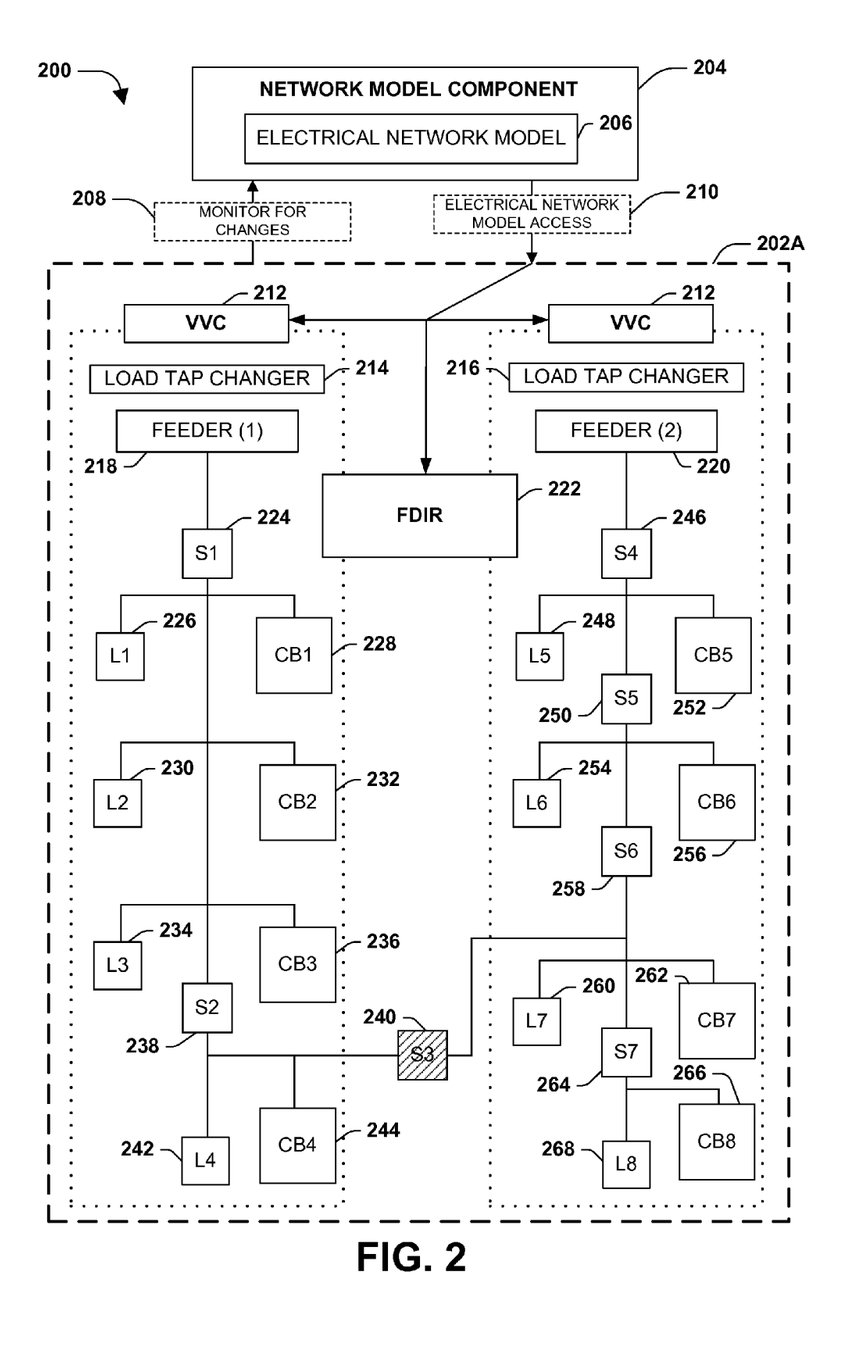
FIG. 2 is a component block diagram illustrating an exemplary system for maintaining an electrical network model associated with an electrical network.

FIG. 2 illustrates an example of a system 200 configured for maintaining an electrical network model 206 associated with an electrical network 202A. The electrical network 202A may comprise various devices, such as breaker switches, capacitor banks, feeder lines, load tap changers, and/or other electrical equipment. For example, the electrical network 202A may comprise a first feeder line 218 that supplies electrical power to a first load 226 (e.g., a first residential neighborhood), a second load 230 (e.g., a second residential neighborhood), a third load 234 (e.g., a first commercial district), and/or a fourth load 242 (e.g., a second commercial district). The first feeder line 218 may comprise a first capacitor bank 228, a second capacitor bank 232, a third capacitor bank 236, and/or a fourth capacitor bank 244 that may be used by a VVC component 212 to adjust capacitance along the first feeder line 218. The first feeder line 218 may comprise a load tap changer 214, a first breaker switch 224 and a second breaker switch 238. A third breaker switch 240 may be positioned between the first feeder line 218 and a second feeder line 220 comprised within the electrical network 202A. The third breaker switch 240 may be in an open position so that the first feeder line 218 is isolated from the second feeder line 220.

The second feeder line 220 may supply electrical power for a fifth load 248 (e.g., a first industrial district), a sixth load 254 (e.g., a second industrial district), a seventh load 260 (e.g., a third industrial district), and/or an eighth load 268 (e.g., a fourth industrial district). The second feeder line 220 may comprise a fifth capacitor bank 252, a sixth capacitor bank 256, a seventh capacitor bank 262, and/or an eighth capacitor bank 266 that may be used by the VVC component 212 to adjust capacitance along the second feeder line 220. The second feeder line 220 may comprise a load tap changer 216, a fourth breaker switch 246, a fifth breaker switch 250, a sixth breaker switch 258, and/or a seventh breaker switch 264.

The system 200 may comprise a network model component 204. The network model component 204 may be configured to maintain the electrical network model 206 that describes the electrical network 202A. For example, the electrical network model 206 may comprise measurement data (e.g., load information associated with the first through eighth loads; capacitance along the first feeder line 218 and/or the second feeder line 220; and/or other measurement data), switch status data (e.g., an indication that the third breaker switch 240 is open, and that the first, second, fourth, fifth, sixth, and seventh breaker switches are closed), and/or a variety of other information about the electrical network 202A. The network model component 204 may be configured to monitor 208 the electrical network 202A for changes (e.g., changes made by the VVC component 212, a FDIR component 222, physical device changes, and/or changes made by other components). The network model component 204 may provide the VVC component 212, the FDIR component 222, and/or other components with access 210 to the electrical network model 206. In this way, a component may have access to relatively up-to-date and/or accurate information describing the electrical network 202A (e.g., the VVC component 212 may be able to access recent changes to the electrical network 202A by the FDIR component 222 when performing a power factor correction operation, as opposed to utilizing stale information that may yield suboptimal decisions).

The network model component 204 may be configured to detect a network change by the VVC component 212. That is, the VVC component 212 may be configured to perform VVC functionality, such as a power factor correction operation, a voltage correction operation, a phase correction operation, and/or other functionality. The VVC functionality may alter the electrical network 202A (e.g., change a capacitance along a feeder line). In this way, the network model component 204 may update the electrical network model 206 based upon the network change by the VVC component 212. It may be appreciated that one example of updating an electrical network model based upon a network change by a VVC component is illustrated in example 400 of FIG. 4.

The network model component 204 may be configured to detect a network change by the FDIR component 222. That is, the FDIR component 222 may be configured to perform FDIR functionality, such as fault isolation, load restoration, and/or other functionality. The FDIR functionality may alter the electrical network 202A (e.g., close a breaker switch to electrically connect two feeder lines so that a feeder line may supply electrical power to another feeder line). In this way, the network model component 204 may update the electrical network model 206 based upon the network change by the FDIR component 222. It may be appreciated that one example of updating an electrical network model based upon a network change by a FDIR component is illustrated in example 300 of FIG. 3.

Figure 3:
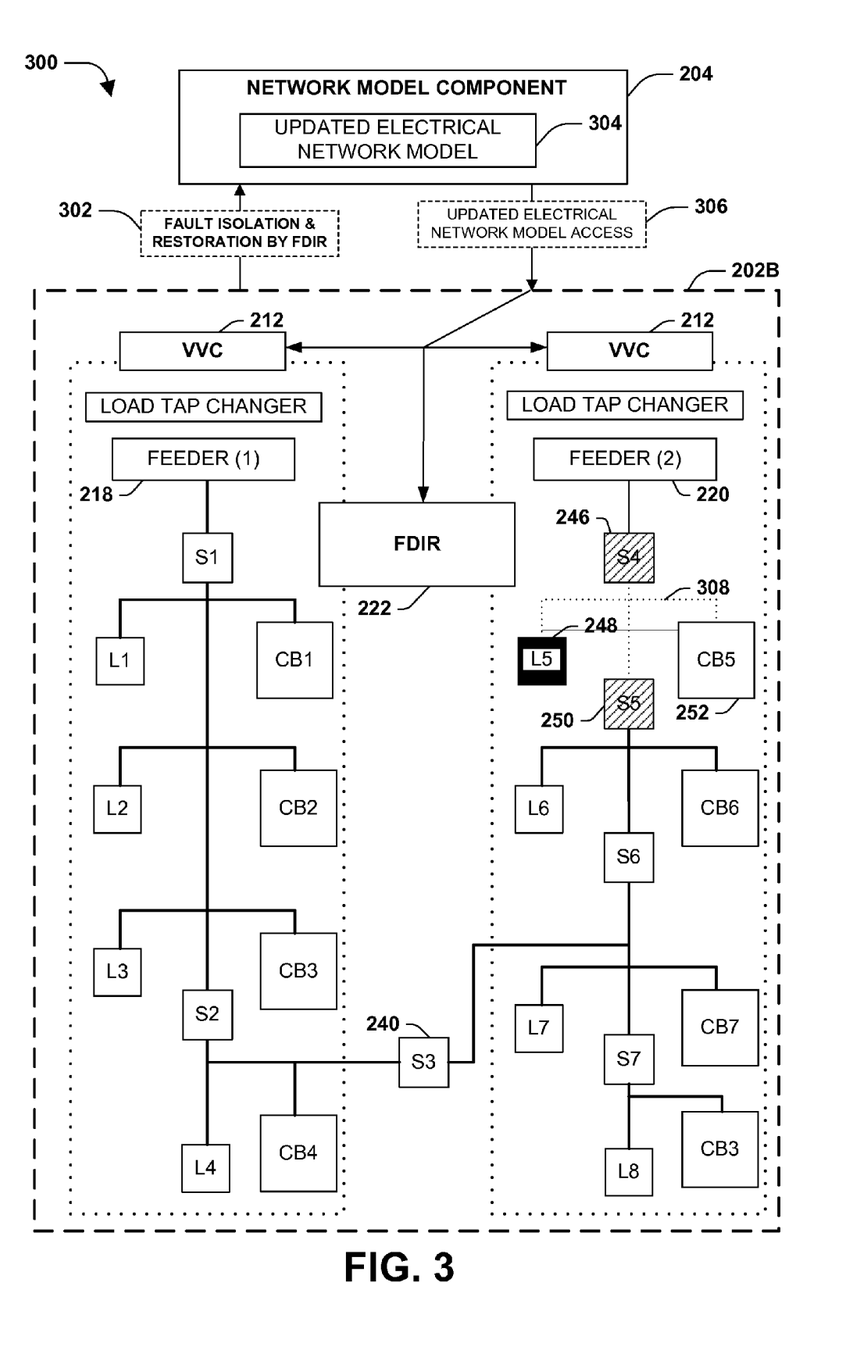
FIG. 3 is a component block diagram illustrating an exemplary system for synchronizing an FDIR component and a VVC component associated with an electrical network.

FIG. 3 illustrates an example of a system 300 configured for synchronizing an FDIR component 222 and a VVC component 212 associated with an electrical network 202B. It may be appreciated that in one example, the electrical network 202B may correspond to the electrical network 202A of FIG. 2. For example, the electrical network 202B may comprise a first feeder line 218, a second feeder line 220, one or more breaker switches (e.g., a third breaker switch 240, a fourth breaker switch 246, a fifth breaker switch 250, and/or other breaker switches), one or more loads (e.g., a fifth load 248 and/or other loads), one or more capacitor banks (e.g., a fifth capacitor bank 252 and/or other capacitor banks), etc.

The system 300 may comprise a network model component 204. The network model component 204 may be configured to maintain an electrical network model (e.g., an updated electrical network model 304) and/or provide access to the electrical network model (e.g., the FDIR component 222, the VVC component 212 and/or other components may access 306 the updated electrical network model 304). The network model component 204 may be configured to update the electrical network model based upon a network change (e.g., a network change 302 by the FDIR component during fault isolation and restoration).

In one example of updating the electrical network model to create the updated electrical network model 304, the FDIR component 222 may detect a fault associated with the fifth load 248. The FDIR component 222 may isolate the fault by opening the fourth breaker switch 246 and the fifth breaker switch 250 in order to isolate a fault area 308 from a healthy portion of the electrical network 202B (e.g., a remaining portion of the second feeder line 202, such as the sixth load, the sixth breaker switch, etc.). Because opening the fourth breaker switch 246 and/or the fifth breaker switch 250 may interrupt a supply of electrical power along the second feeder line 220 to non-faulty loads (e.g., a sixth load, a seventh load, and/or an eighth load may experience a power outage), the FDIR component 222 may close the third breaker switch 240 so that the first feeder line 218 may supply electrical power to the non-faulty loads for load restoration. The network model component 204 may detect the network change 302 by the FDIR component 222 (e.g., the closing of the third breaker switch 240, the opening of the fourth breaker switch 246 and the fifth breaker switch 250, etc.). The network model component 204 may update the electrical network model (e.g., the electrical network model 206 of FIG. 2) to create the updated electrical network model 304.

The updated electrical network model 304 may be made available to various components, such as the VVC component 212. In this way, the VVC component 212 may perform VVC functionality (e.g., power factor correction, voltage correction, phase correction) based upon the updated network model 304. For example, the VVC component 212 may determine that the fifth capacitor bank 252 is no longer available, and that the first through fourth capacitor banks of the first feeder line 218 are now available to provide capacitance (e.g., current) to the non-faulty loads of the second feeder line 220 (e.g., the sixth load, the seventh load, and/or the eighth load).

In this way, the FDIR component 222 and the VVC component 212 may be synchronized through the updated electrical network model 304.

Figure 4:
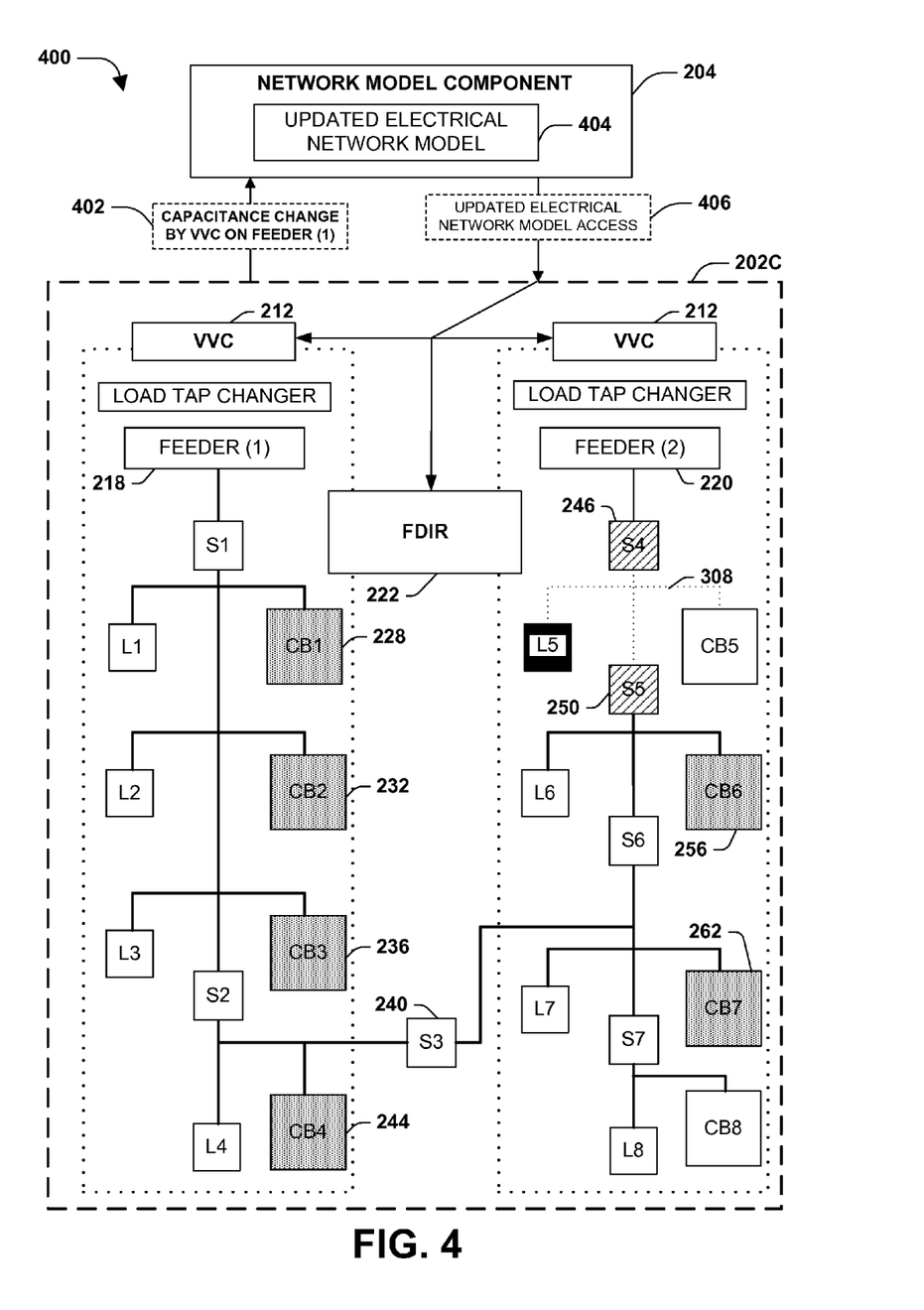
FIG. 4 is a component block diagram illustrating an exemplary system for synchronizing an FDIR component and a VVC component associated with an electrical network.

FIG. 4 illustrates an example of a system 400 configured for synchronizing an FDIR component 222 and a VVC component 212 associated with an electrical network 202C. It may be appreciated that in one example, the electrical network 202C may correspond to the electrical network 202A of FIG. 2 and/or the electrical network 202B of FIG. 3. For example, the electrical network 202C may comprise a first feeder line 218, a second feeder line 220, one or more breaker switches (e.g., a third breaker switch 240 closed by the FDIR component 222 during load restoration, a fourth breaker switch 246 and a fifth breaker switch 250 opened by the FDIR component 222 during fault isolation of a faulty area 308, etc.), one or more loads, one or more capacitor banks (e.g., a first capacitor bank 228, a second capacitor bank 232, a third capacitor bank 236, a fourth capacitor bank 244, a fifth capacitor bank, a sixth capacitor bank 256, a seventh capacitor bank 262, and an eighth capacitor bank), etc.

The system 400 may comprise a network model component 204. The network model component may be configured to maintain an electrical network model (e.g., an updated electrical network model 404) and/or provide access to the electrical network model (e.g., the FDIR component 222, the VVC component 212, and/or other components may access 406 the updated electrical network model 404). The network model component 204 may be configured to update the electrical network model based upon a network change (e.g., a network change 402 by the VVC component 212, such as a change in capacitance along a feeder line).

In one example of updating the electrical network model to create the updated electrical network model 404, the VVC component 212 may identify a capacitance change to the first feeder line 218 and/or the second feeder line 220 based upon the electrical network model (e.g., the updated electrical network model 304 of FIG. 3) indicating that the FDIR component 222 isolated the faulty area 308 of the second feeder line 220 by opening the fourth breaker switch 246 and the fifth breaker switch 250, and that the FDIR component 222 restored electrical power to a non-faulty loads of the second feeder line 220 by closing the third breaker switch 240. The VVC component 212 may adjust the first feeder line 218 and/or the second feeder line 220 (e.g., perform a power factor correction operation, a voltage correction operation, and/or a phase correction operation) based upon the network change by the FDIR component 222. For example, the VVC component 212 may bring the first capacitor bank 228, the second capacitor bank 232, the third capacitor bank 236, the fourth capacitor bank 244, the sixth capacitor bank 256, and/or the seventh capacitor bank 262 online to compensate for the additional load that is supported by the first feeder line 218 to the non-faulty loads of the second feeder line 220. In this way, the VVC component 212 may change the electrical network 202C by altering capacitance along the first feeder line 218 and/or the second feeder line 220 based upon bringing the one or more capacitor banks online. The network model component 204 may detect the network change 402 by the VVC component 212, and may update the electrical network model to create the updated electrical network model 404.

The updated electrical network model 404 may be made available to various components, such as the FDIR component 222. In this way, the FDIR component 222 may perform a load evaluation operation based upon the updated electrical network model 404. For example, the FDIR component 222 may determine that a capacitance along the first feeder line 218 and/or the second feeder line 220 has changed based upon the adjustments by the VVC component 212. In this way, the FDIR component 222 and the VVC component 212 may be synchronized through the updated electrical network model 404.

Figure 5:
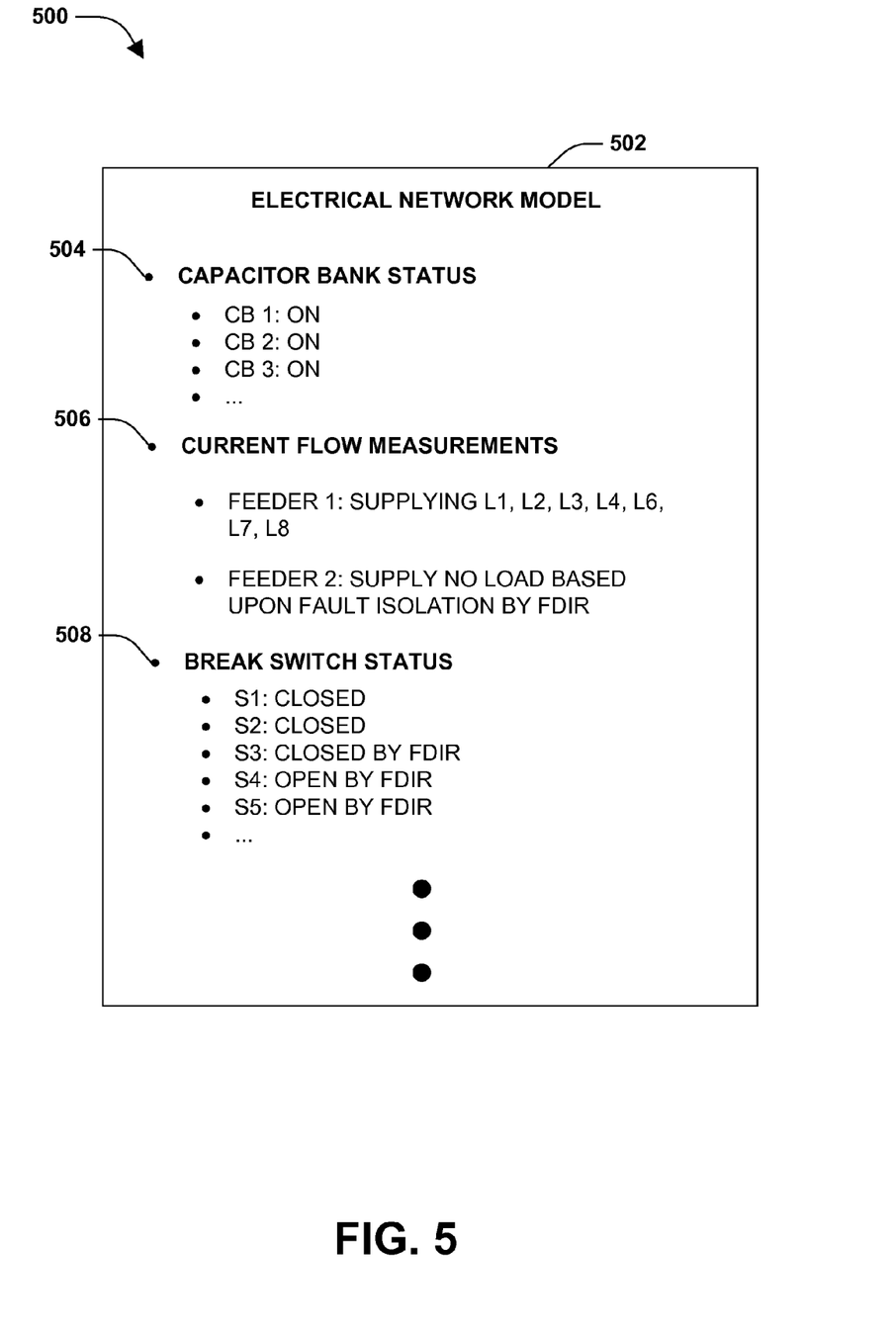
FIG. 5 is an illustration of an example of an electrical network model.

FIG. 5 illustrates an example 500 of an electrical network model 502. It may be appreciated that in one example the electrical network model 502 may correspond to the updated electrical network model 404 of FIG. 4. The electrical network model 502 may comprise information describing an electrical network (e.g., electrical network 202C of FIG. 4). In one example, the electrical network model 502 may comprise capacitor bank status information 504 (e.g., an ON status for a first capacitor bank 228, an ON status for a second capacitor bank 232, an ON status for a third capacitor bank 236, etc.). In another example, the electrical network model 502 may comprise current flow measurement data 506 (e.g., feeder line and/or load information). In another example, the electrical network model 502 may comprise breaker switch status information 508 (e.g., a closed status for a first breaker switch 224, a closed status for a second breaker switch 238, a closed by FDIR status for a third breaker switch 240, an open by FDIR status for a fourth breaker switch 246, an open by FDIR status for a fifth breaker switch 250, etc.). The electrical network model 502 may be made maintained, updated, and/or made available to one or more components, such as an FDIR component 222 and/or a VVC component 212. It may be appreciated that the electrical network model 502 is merely an example, and that an electrical network model 502 may comprise similar or different information and/or may represent such information in a similar or different manner (e.g., database entries within a database).

Figure 6:
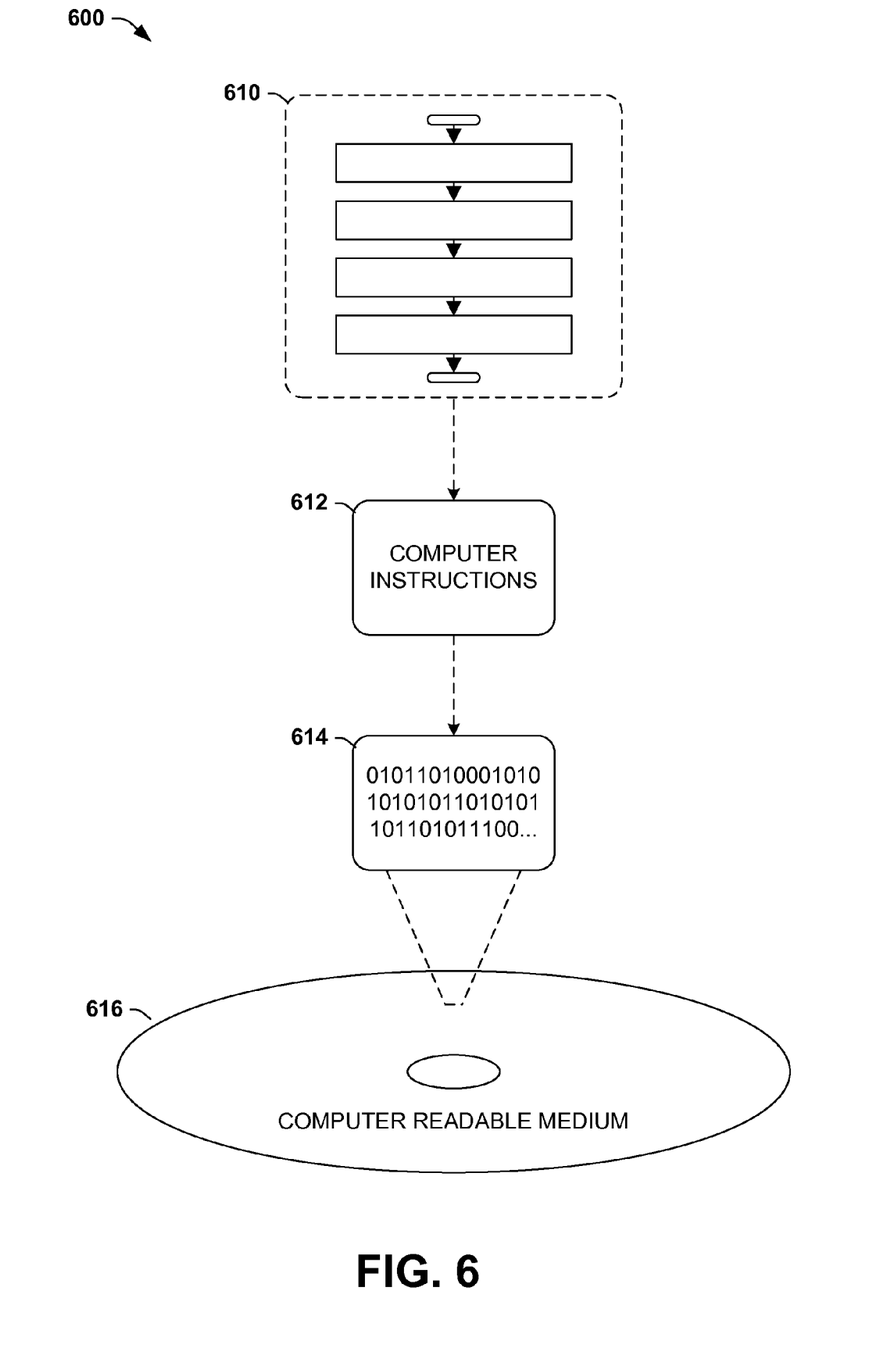
FIG. 6 is an illustration of an exemplary computer-readable medium wherein processor-executable instructions configured to embody one or more of the provisions set forth herein may be comprised.

Still another embodiment involves a computer-readable medium comprising processor-executable instructions configured to implement one or more of the techniques presented herein. An exemplary computer-readable medium that may be devised in these ways is illustrated in FIG. 6, wherein the implementation 600 comprises a computer-readable medium 616 (e.g., a CD-R, DVD-R, or a platter of a hard disk drive), on which is encoded computer-readable data 614. This computer-readable data 614 in turn comprises a set of computer instructions 612 configured to operate according to one or more of the principles set forth herein. In one such embodiment 600, the processor-executable computer instructions 612 may be configured to perform a method 610, such as at least some of the exemplary method 100 of FIG. 1, for example. In another such embodiment, the processor-executable instructions 612 may be configured to implement a system, such as at least some of the exemplary system 200 of FIG. 2, at least some of the exemplary system 300 of FIG. 3, and/or at least some of the exemplary system 400 of FIG. 4, for example. Many such computer-readable media may be devised by those of ordinary skill in the art that are configured to operate in accordance with the techniques presented herein.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used in this application, the terms "component," "module," "system", "interface", and the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

Figure 7:
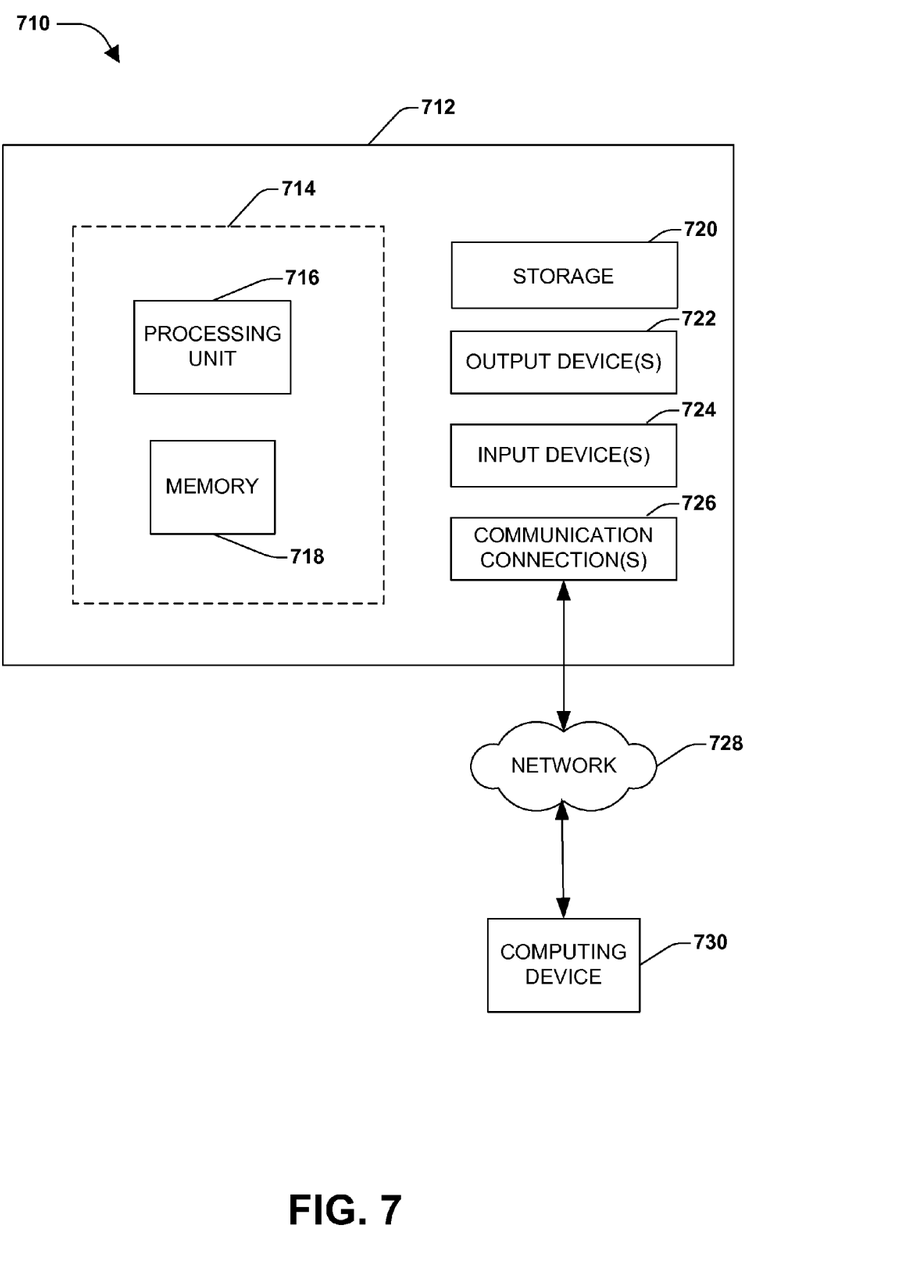
FIG. 7 illustrates an exemplary computing environment wherein one or more of the provisions set forth herein may be implemented.

FIG. 7 and the following discussion provide a brief, general description of a suitable computing environment to implement embodiments of one or more of the provisions set forth herein. The operating environment of FIG. 7 is only one example of a suitable operating environment and is not intended to suggest any limitation as to the scope of use or functionality of the operating environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 7 illustrates an example of a system 710 comprising a computing device 712 configured to implement one or more embodiments provided herein. In one configuration, computing device 712 includes at least one processing unit 716 and memory 718. Depending on the exact configuration and type of computing device, memory 718 may be volatile (such as RAM, for example), non-volatile (such as ROM, flash memory, etc., for example) or some combination of the two. This configuration is illustrated in FIG. 7 by dashed line 714.

In other embodiments, device 712 may include additional features and/or functionality. For example, device 712 may also include additional storage (e.g., removable and/or non-removable) including, but not limited to, magnetic storage, optical storage, and the like. Such additional storage is illustrated in FIG. 7 by storage 720. In one embodiment, computer readable instructions to implement one or more embodiments provided herein may be in storage 720. Storage 720 may also store other computer readable instructions to implement an operating system, an application program, and the like. Computer readable instructions may be loaded in memory 718 for execution by processing unit 716, for example.

The term "computer readable media" as used herein includes computer storage media. Computer storage media includes volatile and nonvolatile, removable and non-removable media implemented in any method or technology for storage of information such as computer readable instructions or other data. Memory 718 and storage 720 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 712. Any such computer storage media may be part of device 712.

Device 712 may also include communication connection(s) 726 that allows device 712 to communicate with other devices. Communication connection(s) 726 may include, but is not limited to, a modem, a Network Interface Card (NIC), an integrated network interface, a radio frequency transmitter/receiver, an infrared port, a USB connection, or other interfaces for connecting computing device 712 to other computing devices. Communication connection(s) 726 may include a wired connection or a wireless connection. Communication connection(s) 726 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

Device 712 may include input device(s) 724 such as keyboard, mouse, pen, voice input device, touch input device, infrared cameras, video input devices, and/or any other input device. Output device(s) 722 such as one or more displays, speakers, printers, and/or any other output device may also be included in device 712. Input device(s) 724 and output device(s) 722 may be connected to device 712 via a wired connection, wireless connection, or any combination thereof. In one embodiment, an input device or an output device from another computing device may be used as input device(s) 724 or output device(s) 722 for computing device 712.

Components of computing device 712 may be connected by various interconnects, such as a bus. Such interconnects may include a Peripheral Component Interconnect (PCI), such as PCI Express, a Universal Serial Bus (USB), firewire (IEEE 1394), an optical bus structure, and the like. In another embodiment, components of computing device 712 may be interconnected by a network. For example, memory 718 may be comprised of multiple physical memory units located in different physical locations interconnected by a network.

Those skilled in the art will realize that storage devices utilized to store computer readable instructions may be distributed across a network. For example, a computing device 730 accessible via a network 728 may store computer readable instructions to implement one or more embodiments provided herein. Computing device 712 may access computing device 730 and download a part or all of the computer readable instructions for execution. Alternatively, computing device 712 may download pieces of the computer readable instructions, as needed, or some instructions may be executed at computing device 712 and some at computing device 730.

Various operations of embodiments are provided herein. In one embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Moreover, the word "exemplary" is used herein to mean serving as an example, instance, or illustration. Any aspect or design described herein as "exemplary" is not necessarily to be construed as advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, at least one of A and B and/or the like generally means A or B or both A and B.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method for synchronizing a fault detection, fault isolation, and load restoration (FDIR) component and a voltage/var control (VVC) component, comprising:
   maintaining an electrical network model describing device connections within an electrical network;
   providing an FDIR component with access to the electrical network model;
   providing a VVC component with access to the electrical network model;
   updating the electrical network model based upon a network change to the electrical network by at least one of the FDIR component or the VVC component to create an updated electrical network model; and
   synchronizing the FDIR component and the VVC component based upon the updated electrical network model.

2. The method of claim 1, wherein the maintaining an electrical network model comprises:
querying one or more field devices within the electrical network for network information.

3. The method of claim 1, wherein the electrical network model comprises at least one of:
status of a capacitor bank;
current flow measurements;
load tap changer information;
status of a breaker switch; or
a circuit topology of the electrical network that describes the device connections within the electrical network.

4. The method of claim 1, further comprising:
making the electrical network model available for polling by at least one of the FDIR component or the VVC component.

5. The method of claim 1, further comprising:
pushing a new network status to at least one of the FDIR component or the VVC component based upon the electrical network model.

6. The method of claim 4, further comprising:
storing the electrical network model within a database of a substation control center.

7. The method of claim 1, wherein the updating the electrical network model comprises:
identifying the network change to the electrical network by the FDIR component based upon a change in status of a breaker switch associated with at least one of a fault isolation operation or a fault restoration operation by the FDIR component.

8. The method of claim 7, wherein the synchronizing comprises:
notifying the VVC component of the updated electrical network model; and
invoking the VVC component to perform at least one of a power factor correction operation, a voltage correction operation, or a phase correction operation based upon the updated electrical network model.

9. The method of claim 7, wherein the updated electrical network model comprises at least one of an indication that a new capacitor bank is available to a feeder line or an indication that a capacitor bank is no longer available to the feeder line.

10. The method of claim 1, wherein the updating the electrical network model comprises:
identifying the network change to the electrical network by the VVC component -based upon a capacitance change within the electrical network by the VVC component.

11. The method of claim 10, wherein the synchronizing comprises:
notifying the FDIR component of the updated electrical network model; and
invoking the FDIR component to perform a load evaluation operation based upon the updated electrical network model.

12. The method of claim 10, wherein the capacitance change corresponds to the VVC component changing a status of a capacitor bank associated with a feeder line.

13. The method of claim 1, further comprising:
controlling at least one of a first feeder line or a second feeder line by the VVC component based upon the electrical network model.

14. A system for synchronizing a fault detection, fault isolation, and load restoration (FDIR) component and a voltage/var control (VVC) component, comprising:
a network model component configured to:
maintain an electrical network model describing device connections within an electrical network;
provide an FDIR component with access to the electrical network model;
provide a VVC component with access to the electrical network model;
update the electrical network model based upon a network change to the electrical network by at least one of the FDIR component or the VVC component to create an updated electrical network model; and
synchronize the FDIR component and the VVC component based upon the updated electrical network model.

15. The system of claim 14, wherein the network model component is configured to:
identify the network change to the electrical network by the FDIR component based upon a change in status of a breaker switch associated with at least one of a fault isolation operation or a fault restoration operation by the FDIR component.

16. The system of claim 15, wherein the network model component is configured to:
notify the VVC component of the updated electrical network model; and
invoke the VVC component to perform at least one of a power factor correction operation or a phase correction operation based upon the updated electrical network model.

17. The system of claim 15, wherein the updated electrical network model comprises at least one of an indication that a new capacitor bank is available to the VVC component or an indication that a capacitor bank is no longer available to the VVC component.

18. The system of claim 14, wherein the network model component is configured to:
identify the network change to the electrical network by the VVC component based upon a capacitance change within the electrical network by the VVC component.

19. The system of claim 18, wherein the network model component is configured to:
notify the FDIR component of the updated electrical network model; and
invoke the FDIR component to perform a load evaluation operation based upon the updated electrical network model.

20. A non-transitory computer-readable medium comprising processor-executable instructions that when executed perform a method for synchronizing a fault detection, fault isolation, and load restoration (FDIR) component and a voltage/var control (VVC) component, comprising:
maintaining an electrical network model describing device connections within an electrical network;
providing an FDIR component with access to the electrical network model;
providing a VVC component with access to the electrical network model;
updating the electrical network model based upon a network change to the electrical network by at least one of the FDIR component or the VVC component to create an updated electrical network model;
synchronizing the FDIR component and the VVC component based upon the updated electrical network model, the synchronizing comprising:
responsive to the network change being performed by the FDIR component, notify the VVC component of the updated electrical network model; and
responsive to the network change being performed by the VVC component, notify the FDIR component of the updated electrical network model.

* * * * *